US008473797B2

(12) United States Patent
Gupta et al.

(10) Patent No.: US 8,473,797 B2
(45) Date of Patent: Jun. 25, 2013

(54) CIRCUITS AND METHODS FOR CLOCK MALFUNCTION DETECTION

(75) Inventors: Chirag Sureshchandra Gupta, Ahmedabad (IN); Saya Goud Langadi, Bangalore (IN); Padmini Sampath, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 14 days.

(21) Appl. No.: 13/209,157

(22) Filed: Aug. 12, 2011

(65) Prior Publication Data
US 2013/0038352 A1 Feb. 14, 2013

(51) Int. Cl.
G06F 11/00 (2006.01)

(52) U.S. Cl.
USPC .......................................................... 714/744

(58) Field of Classification Search
USPC .......................................................... 714/744
See application file for complete search history.

(56) References Cited

U.S. PATENT DOCUMENTS

| 5,850,401 | A * | 12/1998 | Murakami ............... 370/395.62 |
| 6,466,058 | B1 * | 10/2002 | Goldman ..................... 327/49 |
| 7,404,090 | B1 * | 7/2008 | Lewicki et al. ............. 713/300 |
| 2004/0086030 | A1 * | 5/2004 | Xiao et al. ................... 375/219 |
| 2004/0221208 | A1 * | 11/2004 | Floyd et al. .................. 714/50 |
| 2006/0006903 | A1 * | 1/2006 | Choi et al. ..................... 326/30 |
| 2007/0230647 | A1 * | 10/2007 | Pourbigharaz et al. ........ 375/371 |
| 2007/0249293 | A1 * | 10/2007 | Chae et al. .................... 455/76 |
| 2011/0037496 | A1 * | 2/2011 | Ibaraki et al. ................. 326/30 |

OTHER PUBLICATIONS

Steven D. Kugelmass and Kenneth Steigltiz; An Upper Bound on Expected Clock Skew in Syncronous Systems; IEEE Tranasaction on Computers, vol. 39, No. 12, Dec. 1990; p. 1475-1477.*

* cited by examiner

Primary Examiner — Ajay Bhatia
Assistant Examiner — Thien D Nguyen
(74) Attorney, Agent, or Firm — Alan A. R. Cooper; Wade J. Brady, III; Frederick J. Telecky, Jr.

(57) ABSTRACT

Circuit for detecting malfunction of a primary clock in SoCs comprises a primary clock circuit having a GRAY code counter for generating a GRAY code sequence based on a number of clock pulses generated Primary clock. A secondary clock circuit is configured to output a secondary clock pulse on each saturation of a secondary clock counter. A clock gated register circuit is clocked by the secondary clock pulse, and is configured to store a plurality of values of the GRAY code sequence, and update the plurality of values of the GRAY code sequence on each saturation of the secondary clock counter. An error detection circuit is configured to output a detection signal for detecting the malfunction of primary clock based on a comparison of the updated plurality of values of the GRAY code sequence with at least one predetermined threshold associated with the malfunction of primary clock.

17 Claims, 3 Drawing Sheets

FIG. 2

CIRCUITS AND METHODS FOR CLOCK MALFUNCTION DETECTION

TECHNICAL FIELD

Embodiments of the disclosure relate to clock malfunction detection in a System on chip (SoC).

BACKGROUND

With the growing popularity of integrated circuits (ICs) in various electronic applications, such as central processing units (CPUs), application specific integrated circuit (ASICs), and the like, the speed and complexity of ICs have increased significantly. Currently, ICs are increasingly utilized for development of dense high performance integrated circuit based devices that may integrate all (or nearly all) of the components of a complex electronic system into a single chip. Such devices are popularly known as System-on-chip (SoC) devices.

Typically, a SoC device includes a reference clock such that all the system clocks are derived from the reference clock. Sometimes, the reference clock may become faulty or inoperative due to a variety of reasons, such as crystal ageing, wire bond issues on board, silicon ageing and the like, which may be detrimental to the functioning of the SOC device. For several applications including automotive application, it is fatal to have the SoC device non-functional due to malfunction, such as 'out of range' condition, of the reference clock since almost all the system clocks are derived from the reference clock. Accordingly, it is very important for a SoC device to include a circuit that is capable of detecting a reference clock malfunction condition, and take a corrective action in a timely and cost efficient manner.

SUMMARY

Circuits and methods for clock malfunction detection in a System on chip (SoC) are disclosed. In an embodiment, a clock malfunction detection circuit comprises a primary clock circuit, a secondary clock circuit, a clock gated register circuit and an error detection circuit. Primary clock circuit comprises primary clock and a GRAY code counter. The GRAY code counter is configured to generate a GRAY code sequence based on a number of pulses generated by primary clock. The secondary clock circuit comprises a secondary clock and a secondary clock counter. The secondary clock circuit is configured to output a secondary clock pulse on each of a number of saturations of the secondary clock counter. The clock gated register circuit is associated with Primary clock circuit and the secondary clock circuit, and is clocked by the secondary clock pulse. The clock gated register circuit is configured to store a plurality of values of the GRAY code sequence, and to update the plurality of values of the GRAY code sequence for each of a number of saturations of the secondary clock counter. The error detection circuit is associated with the clock gated register circuit and is configured to output a signal indicative of malfunction of primary clock based on a comparison of the updated plurality of values of the GRAY code sequence with at least one predetermined limit associated with the malfunction of primary clock.

In another embodiment, a method for clock malfunction detection in a SoC comprises generating a GRAY code sequence based on a number of clock pulses generated by a primary clock. Further, the method comprises outputting a secondary clock pulse for each of a number of saturations of a secondary clock counter with a secondary clock circuit. A plurality of values of the GRAY code sequence is stored by a clock gated register circuit, and updated for each of a number of saturations of the secondary clock counter. The clock gated register circuit is clocked by the secondary clock pulse. The malfunction of primary clock is detected based on a comparison of the updated values of the GRAY code sequence with at least one predetermined threshold associated with the malfunction.

In yet another embodiment, an electronic device embodying a SoC for clock malfunction detection is disclosed. The electronic device comprises a clock malfunction detection circuit and a phase locked loop (PLL) circuit. The clock malfunction detection circuit comprises a primary clock circuit, a secondary clock circuit, a clock gated register circuit, an error detection circuit and a clock switch multiplexer circuit. Primary clock circuit comprises a primary clock and a GRAY code counter. The GRAY code counter is configured to generate a GRAY code sequence based on a number of pulses generated by primary clock. The secondary clock circuit comprises a secondary clock and a secondary clock counter. The secondary clock circuit is configured to output a secondary clock pulse on each of a number of saturations of the secondary clock counter. The clock gated register circuit is associated with Primary clock circuit and the secondary clock circuit, and is clocked by the secondary clock pulse. The clock gated register circuit is configured to store a plurality of values of the GRAY code sequence, and to update the plurality of values of the GRAY code sequence for each of a number of saturations of the secondary clock counter. The error detection circuit is associated with the clock gated register circuit and is configured to output a signal indicative of malfunction of primary clock based on a comparison of the updated plurality of values of the GRAY code sequence with at least one predetermined limit associated with the malfunction of primary clock. The clock switch multiplexer circuit is associated with the error detection circuit, Primary clock circuit and the secondary clock circuit. The clock switch multiplexer circuit is configured to select the secondary clock circuit and deselect Primary clock circuit based on the signal indicative of the malfunction of primary clock, and to generate an output clock signal. The PLL circuit is coupled with the clock switch multiplexer circuit and configured to shift a phase of the output clock signal to generate a phase shifted output clock signal, and to provide the phase shifted output clock signal to a plurality of components associated with the electronic device.

BRIEF DESCRIPTION OF THE FIGURES

FIG. 2 illustrates a circuit for clock malfunction detection according to an embodiment;

Figure 1:
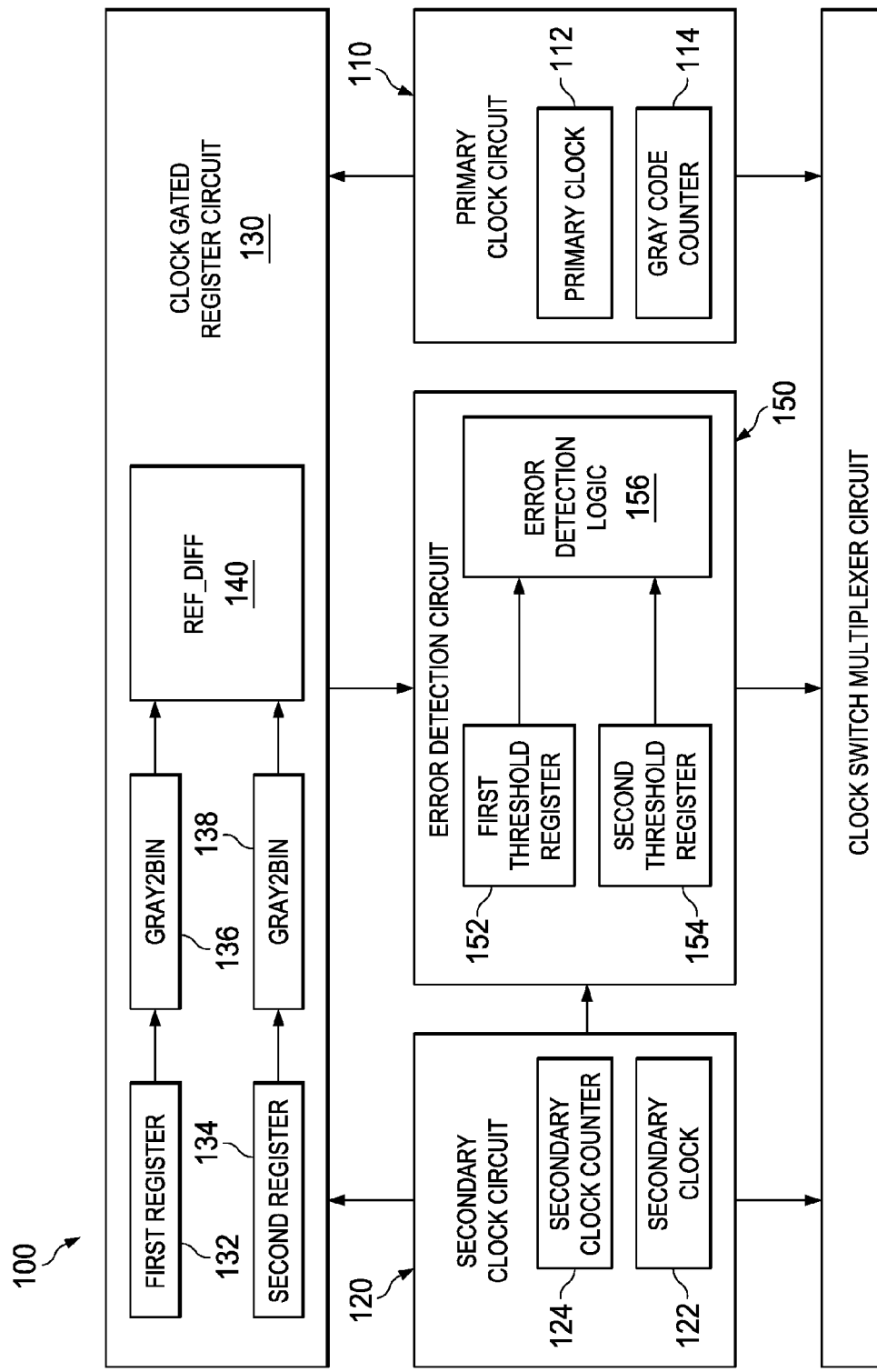
FIG. 1 is a block diagram of a clock malfunction detection circuit according to an embodiment.

The drawings referred to in this description are not to be understood as being drawn to scale except if specifically noted, and such drawings are only exemplary in nature.

DETAILED DESCRIPTION

In an exemplary scenario, malfunction of a clock, such as a reference clock, may be detected by a clock malfunction detection circuit. The clock malfunction detection circuit includes an additional clock operative in a different clock domain than that of the reference clock. The additional clock is configured to monitor the reference clock for any malfunction of the reference clock. Since the reference clock and the additional clock are operating in different clock domains, the additional clock has to be synchronized with the reference clock by employing a synchronization circuit. In an exemplary scenario, a control based bus synchronization scheme may be implemented in the circuit for synchronizing the additional clock with the reference clock. However, introduction of the synchronization circuit may add a latency of two cycles in signal transfer between the additional clock and the reference clock, which is not desirable. Thus, an accurate "out of range" detection on a finer scale is a challenge for such circuits. Moreover, the clock malfunction detection circuit utilizes analog components to detect a malfunction of the reference clock, which is an expensive approach.

Various embodiments of the present disclosure provide solutions for detecting clock malfunction associated with a reference clock for a design application that overcome the above and other limitations, in addition to providing currently unavailable benefits. For instance, various embodiments provide solutions for malfunction detection associated with the reference clock in a seamless manner, irrespective of the difference in operative domains of the reference clock and the additional clock. An embodiment provides solutions for clock malfunction detection based on a digital logic by implementing the clock malfunction circuit with a limited number of logic gates, and therefore offer cost effective solutions. Further, various embodiments of the present disclosure provide circuits for clock malfunction detection that allow a user or a designer to program an accuracy range based on a design of the reference clock. The accuracy range is programmed in one or more programmable registers based on an expected range in which the clock varies. Various embodiments of the present disclosure provides methods and circuits that detects an "out of range clock" condition as well as a condition of a clock being stopped (or an equivalent of stopped). Various embodiments of the present disclosure provide methods and circuits that facilitate interruption of operation of the reference clock when a clock malfunction is detected, and take a corrective action by switching to a secondary clock, thereby avoiding any disruption of operation of a system clock during recovery of the reference clock. Various embodiments of the present disclosure are herein disclosed in conjunction with FIGS. 1 to 4.

FIG. 1 is block diagram illustrating a circuit 100 for malfunction detection of a clock, such as a reference clock, according to one embodiment. The reference clock may be referred to as the "primary clock" of circuit 100, although the terms "primary" and "secondary", and the like, are not to be construed as connoting a specific order of importance or operation. As depicted, circuit 100 includes a primary clock circuit 110, a secondary clock circuit 120, a clock gated register circuit 130, and an error detection circuit 150. Primary clock circuit 110 and secondary clock circuit 120 are operative in different clock domains, such as a first clock domain and a second clock domain, respectively.

Primary clock circuit 110 includes a primary clock 112 and a GRAY code counter 114 coupled with or connected to primary clock 112. Primary clock 112 is configured to generate a primary clock signal. The primary clock signal may be in a range of, for example, approximately 4 megahertz (MHz) to approximately 150 MHz. However, any suitable clock frequency signal can be produced depending upon a particular application. In this embodiment, primary clock 112 is a reference clock.

GRAY code counter 114 is configured to generate a GRAY code sequence based on a number of clock pulses generated by primary clock 112. For example, with the generation of every subsequent clock pulse by primary clock 112, the value of the GRAY code sequence is incremented by one. Herein, the GRAY code sequence refers to a sequence of numbers such that every subsequent number differs from the previous number by one bit. An exemplary 2-bit GRAY code sequence is: 00, 01, 11, 10. In this embodiment, GRAY code counter 114 is an M bit counter and the value of M is 8. However, the value of M may be different depending on the design objectives, and a granularity level for which the accuracy of circuit 100 is to be associated.

Primary clock circuit 110 may further include any device or set of devices known in the art to enable generation of the clocked pulses. For instance, primary clock circuit 110 may also be embodied as alone or in combination with a number of sequential and/or combinational elements.

Secondary clock circuit 120 includes a secondary clock 122, and a secondary clock counter 124 coupled with or connected to primary clock 112. Secondary clock 122 is configured to generate a secondary clock signal. In this embodiment, the secondary clock signal is clocked at a frequency of approximately 10 MHz. However, any suitable clock frequency signal may be produced depending upon a particular application.

Secondary clock counter 124 is configured to count a number of secondary clock pulses associated with the secondary clock signal. If the secondary clock counter is an N bit counter and a time period of secondary clock 122 is TS seconds, secondary counter 124 saturates and overflows after every $2^N \times TS$ seconds. For example, for a 3-bit counter associated with the 10 MHz secondary clock, secondary counter 124 saturates and overflows after every 800 nanoseconds (ns). In this embodiment, secondary clock counter 124 is a binary counter.

Secondary clock circuit 120 may further include any device or set of devices capable of generating the clocked pulses. For instance, the secondary clock circuit 120 may also be embodied alone or in combination with a number of sequential and/or combinational elements.

The values M and N of GRAY code counter 114 and secondary clock counter 124, respectively, depend on the frequency of primary clock 112, the frequency of secondary clock 122 and the granularity for which a malfunction of primary clock 112 is to be detected. For example, for an application wherein Primary clock frequency varies from approximately 4 MHz to approximately 150 MHz, and the secondary clock frequency is approximately 10 MHz, the values of M and N may be 8 and 3, respectively.

With reference still to the exemplary embodiment shown in FIG. 1, clock gated register circuit 130 is clocked by the secondary clock pulse. The enable to clock gated register circuit 130 is asserted for a cycle when secondary clock counter 124 saturates. The input of clock gated register circuit 130 is coupled with or connected to an output of primary clock circuit 110, such that clock gated register circuit 130 stores a plurality of values of the GRAY code sequence, and updates the plurality of values of the GRAY code sequence on each of a number of saturations of secondary clock counter 124. The plurality of values of the GRAY code sequence includes a current value of the GRAY code sequence at a current saturation of the secondary clock counter, and a previous value of the GRAY code sequence at a previous saturation of the GRAY code sequence.

Clock gated register circuit 130 also includes a first register 132 and a second register 134 configured to store the current value and the previous value of the GRAY code sequence. When the enable to clock gated register circuit 130 is asserted (on receiving the secondary clock pulse), second register 134 latches Primary clock count value, and first register 132 latches the value of second register 134. The values in first register 132 and second register 134 are updated when secondary clock counter 124 is saturated. For example, assuming that at a first saturation of secondary clock counter 124, the value of the GRAY code counter is 0100, then the first register stores a GRAY code value 0100, and the second register stores the GRAY code value 0000. Now, at a subsequent saturation or overflow of secondary clock counter 124, the value of first register 132 is updated with a current value of GRAY code counter 114, such as 1000 (assuming that secondary clock counter 124 is a 3-bit counter and is free running), and second register 134 is updated with the previous value of the of GRAY code counter 114, such as 0100.

Clock gated register circuit 130 includes two GRAY to binary converter circuits (represented as GRAY2BIN 136 and GRAY2BIN 138), and a difference circuit 140. Circuits GRAY2BIN 136 and GRAY2BIN 138 facilitate conversion of the current and the previous value of the GRAY code sequence to corresponding binary values, and the difference circuit 140 determines a signed difference (e.g., REF_DIFF) of the GRAY to binary converted values associated with the current and the previous values of the GRAY code sequence. The signed difference REF_DIFF is indicative of the GRAY code counter value when secondary clock counter 124 saturates.

Clock gated register circuit 130 is coupled with or connected to error detection circuit 150. Error detection circuit 150 is configured to output a signal indicative of malfunction of primary clock based on a comparison of the difference (REF_DIFF) of the updated plurality of values of the GRAY code sequence with at least one predetermined threshold associated with the malfunction of primary clock. At least one predetermined threshold for clock malfunction detection includes a "primary clock count threshold low" and a "primary clock count threshold high." Error detection circuit 150 includes at least one threshold register for storing the at least one predetermined threshold. For example, error detection circuit 150 includes a first threshold register 152 for storing the "primary clock count threshold low" and a second threshold register 154 for storing the "secondary clock count threshold high." The value of the "primary clock count threshold" and the "primary clock count threshold high" may be determined based on the following expression:

$$\text{"primary clock count threshold low"} + T < 2^N \times TS/TR < \text{"primary clock count threshold high"} + T$$

where,
TR is Primary clock period,
TS is the secondary clock period, and
T is the tolerance. The value of tolerance may be 0x0, 0x1, or 0x2, depending on the desired accuracy on the clock malfunction detection.

Values of the "primary clock count threshold low" and the "primary clock count threshold high" facilitate in defining the granularity to which the "out of range clock" malfunction condition is to be detected. In certain embodiments, first threshold register 152 and second threshold register 154 are programmable to accommodate various values of the clock count based on design objectives and the granularity for which a malfunction of primary clock 112 is to be detected. For example, at reset, first threshold register 152 and second threshold register 154 are initialized to support a complete range of input frequencies associated primary clock 112, and thereafter, based on specific application objectives, the values of the at least one predetermined threshold is tracked in first threshold register 152 and second threshold register 154 to determine whether or not primary clock 112 is operating within the specified range. Circuit 100 is disabled prior to updating first threshold register 152 and second threshold register 154, and after updating first threshold register 152 and second threshold register 154, circuit 100 is enabled for clock malfunction detection.

Error detection circuit 150 includes an error detection logic circuit 156 connected to or coupled with first threshold register 152 and second threshold register 154. Error detection logic circuit 156 is configured to compare the values of the updated plurality of values of the GRAY code sequence with at least one predetermined threshold associated with the malfunction of primary clock 112.

Circuit 100 includes a clock switch multiplexer circuit, which might be configured to function as a glitch free clock multiplexer circuit. With reference to the embodiment shown in FIG. 1, circuit 100 includes a clock switch multiplexer circuit 160 coupled with or connected to primary clock circuit 210, secondary clock circuit 220 and error detection circuit 260. The clock switch multiplexer circuit is configured to facilitate a switching to the secondary clock 122 when the malfunction of primary clock 112 is detected. The clock switch multiplexer circuit is configured to select secondary clock circuit 220 and deselect primary clock circuit 210 when the malfunction of primary clock is detected. The malfunction of primary clock 112 is one of an "out of range clock" condition and a "clock stopped" condition. Clock switch multiplexer circuit 160 is a glitch free clock switch multiplexer circuit.

When secondary clock counter 124 is saturated and the value of REF_DIFF is determined to be outside of the predetermined threshold, but not 0x0, primary clock 112 is determined to be in the "out of range clock" condition. On determining the "out of range clock" condition of primary clock 112, clock switch multiplexer circuit 160 is enabled to facilitate a switching of a system clock from primary clock 112 to secondary clock 122. The malfunction of primary clock 112 is the "out of range clock" condition and not the "clock stopped" condition (for example, Primary clock is still switched on).

When secondary clock counter 124 is saturated and "REF_DIFF" vector is evaluated to be 0x0 or period $>2^N \times TS$ (which is a very slow running condition of primary clock), primary clock 112 is determined to be in the "clock stopped" condition and the signal "CLK1_STOPPED" is asserted. The signal "CLK1_STOPPED" switches the system clock to secondary clock 122 from primary clock 112. The "CLK1_STOPPED" signal reflects the malfunction condition that primary clock 112 is switched off In the present embodiment, since the reference clock is stopped, the value of REF_DIFF is 0x0.

Figure 2:
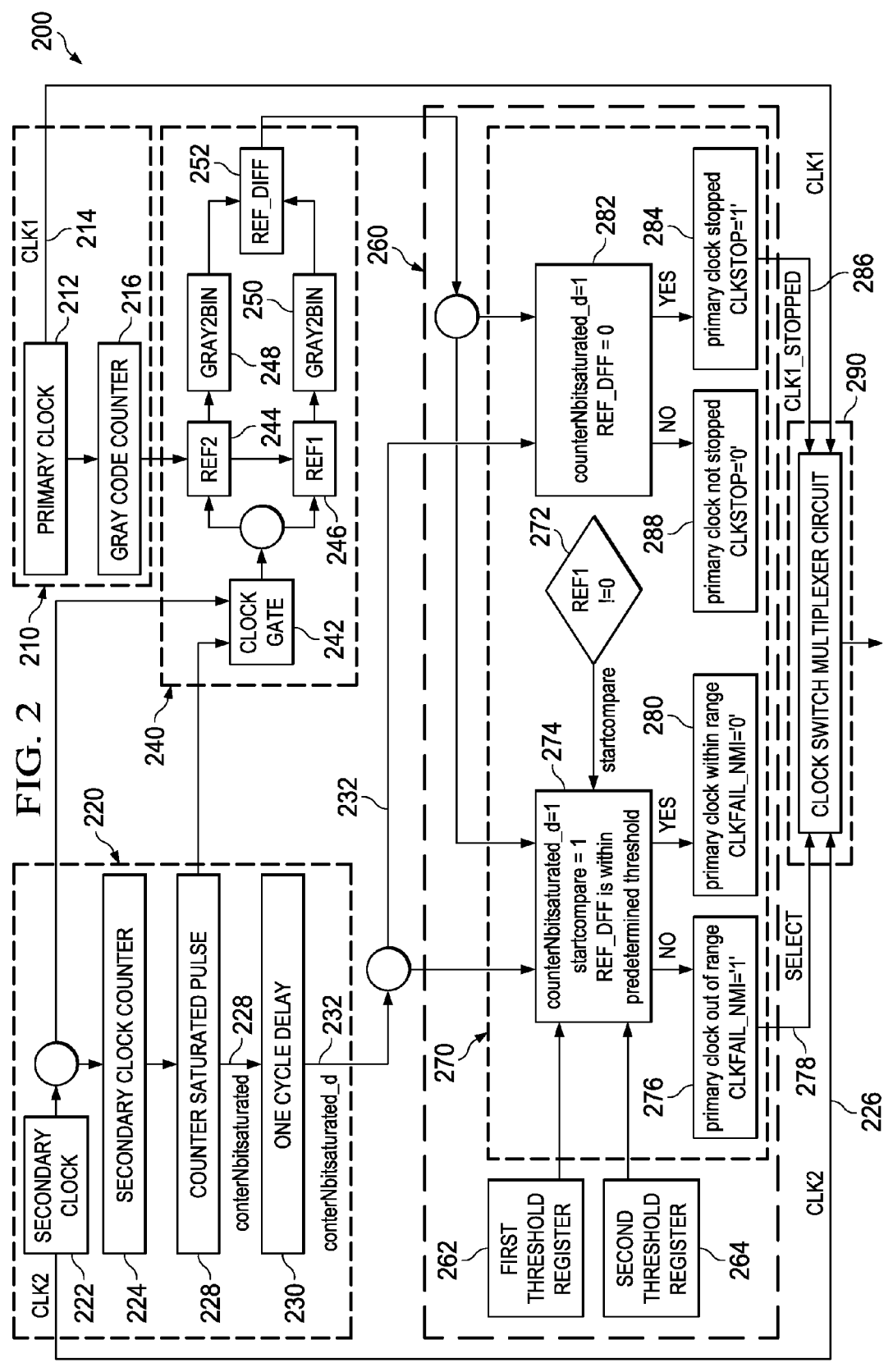

FIG. 2 illustrates a circuit for clock malfunction detection according to another embodiment. As depicted, the circuit 200 is logically divided into five parts: a primary clock circuit 210, a secondary clock circuit 220, a clock gated register circuit 240, an error detection circuit 260, and a clock switch multiplexer circuit 290. Herein, the detection of a clock malfunction is explained in conjunction with the exemplary embodiment of clock malfunction detection circuit 200 shown in FIG. 2, and primary clock circuit 210 is operating in a first clock domain and secondary clock circuit 220 is operating in a second clock domain. Herein, the term "clock malfunction" refers to one of an "out of range clock" condition and a "clock stopped" (or an equivalent of stopped)

condition of a primary clock, such as a reference clock associated with a design application.

Primary clock circuit 210 includes a primary clock 212 that is configured to generate a primary clock signal, also referred to as CLK1 signal 214. Primary clock circuit 210 also includes a GRAY code counter 216 coupled with or connected to primary clock 212 and configured to determine a number of pulses associated with the primary clock signal. The primary clock frequency is in the range of approximately 4-150 MHZ.

Secondary clock circuit 220 includes a secondary clock 222 and a secondary clock counter 224 coupled with or connected to secondary clock 222. Secondary clock 222 is configured to generate a secondary clock signal, also referred to as CLK2 signal 226. Secondary clock counter 224 is a binary counter, and is configured to overflow or saturate after a time period associated with the time period of the secondary clock ($2^N \times TS$ seconds). Secondary clock circuit 220 is configured to output a secondary clock pulse for each of a number of saturations of secondary clock counter 224.

Clock gated register circuit 240 is coupled with or connected to an output of primary clock circuit 210. Also, clock gated register circuit 240 is clocked by the secondary clock pulse. Clock gate element 242 is configured to receive the secondary clock pulse so that an enable to clock gated register circuit 240 is asserted. When the enable to clock gated register circuit 240 is asserted, clock gated register circuit 240 is configured to store a current value and a previous value of the GRAY code sequence.

Clock gated register circuit 240 includes a first register 244 and a second register 246 for storing the current value and a previous value of the GRAY code sequence. When secondary clock counter 224 is saturated, the enable to clock gated register circuit 240 is asserted by the secondary clock pulse, and first register 244 and second register 246 updates the stored values of the GRAY code sequence.

GRAY code counter 216 and secondary clock counter 224 are cleared at power-on. When secondary clock counter 224 is saturated (after every $2^N \times TS$ seconds), the enable to clock gated register circuit 240 is asserted for determining the GRAY code counter value. In an exemplary embodiment, when instead of the GRAY code counter, a binary counter is implemented in primary clock circuit 210, then, at the saturation of secondary clock counter 224, a bus synchronization scheme is implemented for synchronizing the value of secondary clock counter 224 from the second clock domain to the first clock domain. The bus synchronization scheme introduces a 2-cycle latency for the transfer of the secondary clock signal from the second clock domain to the first clock domain. This 2-cycle latency is undesirable as secondary clock counter 224 is a free running counter, and renders primary clock counter off track with respect to secondary clock counter 224. Implementing GRAY code counter 216 in primary clock circuit 210 precludes a need of synchronizing the value of secondary clock counter 224 from the second clock domain to the first clock domain.

Consider an exemplary scenario, wherein primary clock circuit 210 includes an 8-bit binary counter instead of the GRAY code counter, and secondary clock counter 224 is a 3-bit binary counter. Also, the clock frequencies of primary clock 212 and the secondary clock are assumed to be approximately 100 MHz and approximately 10 MHz respectively, such that a ratio of clock frequencies of primary clock 212 and secondary clock 222 is 10. Now, when secondary clock 222 is saturated after 800 ns ($2^N \times TS$), a value of secondary clock counter 224 (for example, 0x3) is transferred from the second clock domain to the first clock domain. However, said transfer from the second clock domain to the first clock domain introduces a 2-cycle latency, meaning that the value of secondary clock counter 224 is captured 20 cycles after the desired instant, which is undesirable.

However, wherein primary clock circuit 210 includes an 8-bit GRAY counter, and the secondary clock counter is a 3-bit binary counter, the value of the secondary counter (for example, 0x3) is captured with a maximum of a one bit delay (for example, at 0x2 or 0x4), which is tolerable. Accordingly, an implementation of the GRAY code counter 216 in primary clock circuit 210 precludes the need of an implementation of a synchronization circuit for transfer of secondary counter values from the second clock domain to the first clock domain.

In another exemplary scenario, when secondary clock counter 224 is saturated (after $2^N \times TS$ seconds), a counter associated with primary clock 212 is cleared in order to enable counting for a subsequent phase. Accordingly, a clear (CLR) signal is transferred from the secondary clock domain to Primary clock domain, which leads to introduction of the 2-cycle latency.

The 2-cycle latency is avoided by implementing two registers, such as a first register 244 and a second register 246 in clock gated register circuit 240. First register 244 and second register 246 are configured to store the current value and the previous value of the GRAY code sequence. When the enable to clock gated register circuit 240 is asserted upon saturation of secondary clock counter 224, second register 246 stores the current value of the GRAY code sequence primary clock count value, and first register 244 stores the value of second register 246 (which is the previous value of the GRAY code sequence). First register 244 and second register 246 are M-bit registers. The values in first register 244 and second register 246 gets updated when secondary clock counter 224 is saturated. The updated values of first register 244 and second register 246 are fed to a plurality of GRAY to binary converters, (represented as GRAY2BIN 248, and GRAY2BIN 250). The outputs of the GRAY to binary converters GRAY2BIN 248 and GRAY2BIN 250 are fed to a difference circuit, such as a difference circuit 252 (represented as REF_DIFF 252). Difference circuit 252 is configured to output a signed difference of the values stored in first register 244 and the second register 246. Since, at every saturation from among a plurality of saturations of secondary clock counter 224 (which occurs after a constant time period $2^N \times TS$), the values of first register 244 and second register 246 remain almost the same, the need to reset the GRAY code counter 216 after every saturation is precluded. The GRAY code counter 216 is also kept free running using the clock gated reference register circuit 240, and precludes a need to clear the GRAY code counter 216 every time secondary clock counter 224 saturates. The signed difference of the counter values stored in first register 244 and second register 246 is indicative of the value of primary clock signal when secondary clock counter 224 saturates.

When secondary clock counter 224 saturates, secondary clock counter 224 generates a counter saturated signal 228 (shown as "counterNbitSaturated"). However, the values of first register 244 (REF1) and second register 246 (REF2) are updated one cycle after secondary clock counter 224 saturates, and accordingly, counter saturated signal 228 (counterNbitSaturated) is delayed by one cycle of secondary clock counter 224 (shown as 230). The one cycle delayed counter saturated signal 232 is shown as "counterNbitSaturated_d" (refer to FIG. 2).

With reference still to the embodiment shown in FIG. 2, clock gated register circuit 240 is coupled with or connected to error detection circuit 260. Error detection circuit 260 is configured to output a signal indicative of malfunction of primary clock 212 based on a comparison of a value of difference REF_DIFF (output from the difference circuit 252) of the updated plurality of values of the GRAY code sequence received from clock gated register circuit 240 with the at least one predetermined threshold associated with the malfunction detection of primary clock 212. The at least one predetermined threshold includes a single value or a plurality of values for defining the limits of predetermined threshold associated with the malfunction detection of primary clock. For example, a single value of the predetermined threshold includes a value of the REF_DIFF, beyond which the malfunction of primary clock is ascertained. In another example, the predetermined threshold includes a range of values, such as a primary clock count threshold low and a primary clock count threshold high, that defines a boundary of the range of values of REF_DIFF associated with the malfunction detection.

Without limiting the scope of the present technology, error detection circuit 260 includes at least one threshold register for storing the at least one predetermined threshold, and a clock malfunction detection logic 270 operative to compare the updated plurality of values of the GRAY code sequence with at least one predetermined threshold. The at least one register includes a first threshold register 262 for storing a "primary clock count threshold low" value and a second threshold register 264 for storing a "primary clock count threshold high" value. Clock malfunction detection logic 260 compares the updated plurality of values (e.g, the value of REF_DIFF) of the GRAY code sequence with the "primary clock count threshold low" and the "primary clock count threshold high" in response to the signal counterNbitSaturated_d 232 (e.g. counterNbitSaturated_d 232=1).

In response to the comparison by clock malfunction detection logic 270, error detection circuit 260 outputs the signal associated with the detection of the malfunction of primary clock.

When a reset de-assertion occurs, GRAY code counter 216 and secondary clock counter 224 starts running. However, since primary clock 212 and secondary clock 222 are asynchronous, an asynchronous start for the counter associated with primary clock and secondary clock counter 224 renders said counters out of synchronization, thereby leading to a false alarm for the "out of range clock" condition. In order to avoid such a false alarm, a first assertion of the "counterNbitSaturated" signal is ignored. Accordingly, error detection logic 260 is enabled when first register 236 is updated to a nonzero value (marked as 272 in FIG. 2). Once first register 236 is updated, the initial time difference between the start of GRAY code counter 216 and secondary clock counter 224 is nullified and the signed reference difference (REF_DIFF) is used for detection of the "out of range clock" condition.

The value of the REF_DIFF is determined to be non-zero (at the block 272). In response to determination of the non-zero value of the REF_DIFF, the value of the REF_DIFF is compared with at least one predetermined threshold by generating a signal, such as 'startcompare'. On initiating the 'startcompare' signal, if clock error detection logic 270 determines (at the block marked as 274) that secondary clock counter 224 is saturated (such as when the value of the signal counterNbitsaturated_d=1), and the value of the REF_DIFF is outside of the predetermined threshold range, but not 0x0, then primary clock 212 is determined to be in the "out of range clock" condition (as shown by the block marked as 276). On determining the "out of range clock" condition of primary clock 212, a clock fail non-maskable interrupt 278 (shown as CLKFAIL_NMI) is asserted for interrupting the operation of primary clock circuit 210. The clock switch multiplexer circuit 290 is enabled to switch a system clock from primary clock 212 to secondary clock 222 when a SELECT signal is changed from '0' to '1'. In the present embodiment, the malfunction of primary clock 212 is the "out of range clock" condition and not the "clock stopped" condition (for example, primary clock is still switched on).

If clock error detection logic 270 determines (at the block marked as 274) that secondary clock counter 224 is saturated, such as when counterNbitsaturated_d=1, and the value of the REF_DIFF is within the predetermined threshold range, then no action is required (shown as block marked as 278). In the present embodiment, signal clock fail non-maskable interrupt 278 (CLKFAIL_NMI)=0.

If clock error detection logic 260 determines (at the block marked as 282) that secondary clock counter 224 is saturated, such as when signal 232 (counterNbitsaturated_d)=1, and the value of the REF_DIFF is evaluated to be 0x0 or very slow (period>$2^N$×TS), primary clock 212 is determined to be in the "clock stopped" condition (shown at the block marked 284). A signal, such as signal 286 (shown as "CLK1_STOPPED") indicating that primary clock is stopped (clock stopped condition) is asserted (at the block marked as 266). The signal "CLK1_STOPPED" switches the system clock to secondary clock 222 from primary clock 212. The "CLK1_STOPPED" signal reflects the malfunction condition that primary clock 112 is switched off and not ticking. In the present embodiment, the reference clock is off, and accordingly the value of REF_DIFF is 0x0.

If clock error detection logic 270 determines (at the block marked as 282) that secondary clock counter 224 is saturated, such as when signal 232 (counterNbitsaturated_d)=1, and the value of the REF_DIFF is evaluated to be 0x0, primary clock 212 is determined to be running (at the block marked as 288). In the present embodiment, the signal CLKSTOP=0.

Accordingly, various embodiments of the present disclosure provide circuits that can be used for clock malfunction detection in various designs irrespective of the clock frequencies utilized in the design application. For instance, circuit 100, and other variants of circuit 100, are utilized for detecting malfunction of a reference clock in a design application, such as an automotive application.

Figure 3:
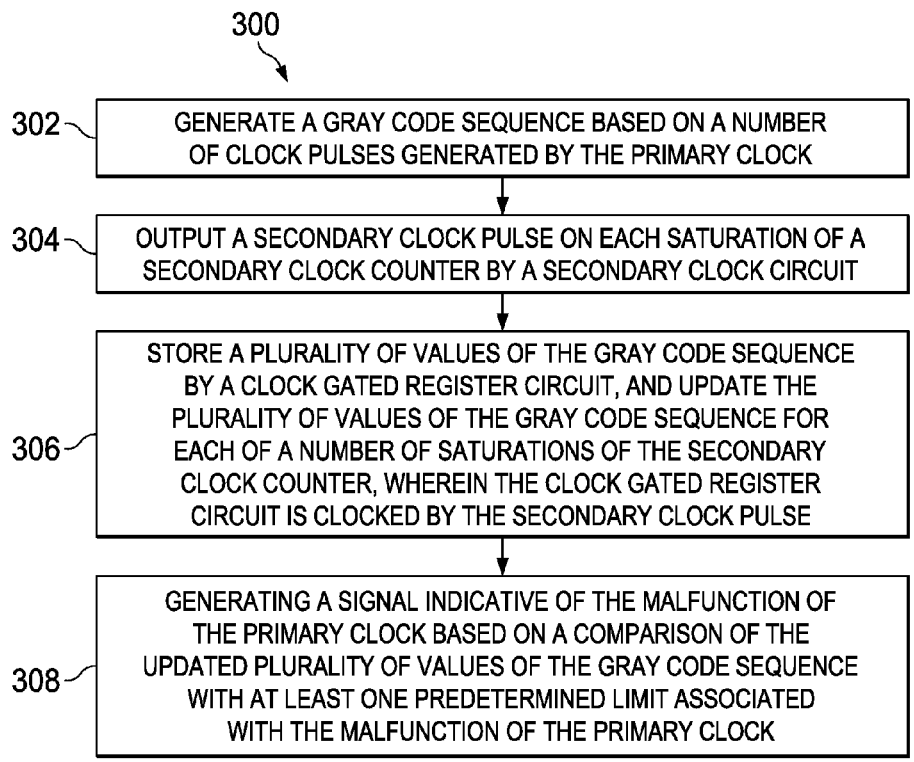
FIG. 3 is a flow diagram of a method for clock malfunction detection according to an embodiment.

FIG. 3 is a flow diagram of a method 300 for detecting malfunction in a clock in accordance with an embodiment. The method 300 includes monitoring a primary clock signal by a secondary clock signal. The method 300 also includes outputting, based on a comparison of a value of the monitored primary clock signal with at least one threshold for malfunction detection, a signal for detecting the malfunction of primary clock. In certain embodiments, the signal is indicative of malfunction of primary clock. In other embodiments, method 300 includes facilitating switching to the secondary clock from the primary clock in case a malfunction of the primary clock is detected. In yet other embodiments, operations of method 300 are performed by a clock malfunction detection circuit (see FIG. 2).

At 302, method 300 includes generating a GRAY code sequence based on a number of clock pulses generated by primary clock. Primary clock is the reference clock to a design application, such as an automotive application. An example of primary clock is primary clock 212 (see FIG. 2). Primary clock is configured to operate with the GRAY code counter, such as the GRAY code counter 216. The GRAY code counter is configured to generate the GRAY code sequence based on the counting of the pulses generated by primary clock signal.

At 304, method 300 includes outputting a secondary clock pulse for each of a plurality of saturations of a secondary clock counter by a secondary clock circuit. The secondary clock circuit is an example of secondary clock circuit 220 of FIG. 2. The secondary clock counter is an example of secondary clock counter 224 of FIG. 2. In an exemplary embodiment, if the secondary clock counter is an N bit counter and a time period of secondary clock 222 is TS seconds, secondary counter 124 saturates and overflows after every $2^N \times TS$ seconds.

At 306, a plurality of values of the GRAY code sequence is stored by a clock gated register circuit. Also, the plurality of values of the GRAY code sequence is updated for each of a plurality of saturations of the secondary clock counter, wherein the clock gated register circuit is clocked by the secondary clock pulse. An example of the clock gated register circuit is clock gated register circuit 240 (see FIG. 2).

In an exemplary embodiment, the plurality of values of the GRAY code sequence includes a current value and a previous value of the GRAY code sequence. Upon asserting the enable to the clock gated register circuit at the saturation of the secondary clock counter, the current and the previous values of the GRAY code sequence are latched in registers associated with the clock gated register circuit. The current and the previous values of the GRAY code sequence are converted into binary, and a difference between the current and the previous values of the GRAY code sequence is determined At 308, a signal indicative of malfunction of primary clock is detected based on a comparison of the updated plurality of values of the GRAY code sequence with at least one predetermined threshold associated with the malfunction of primary clock. An error detection circuit is configured to compare the updated plurality of values of the GRAY code sequence with the at least one predetermined threshold. An example of the error detection circuit is error detection circuit 250 (see FIG. 2).

In an example embodiment, the updated plurality of values of the GRAY code sequence refers to the signed difference (shown as REF_DIFF in FIG. 2) of the current value and the previous value of the GRAY code sequence. The at least one predetermined threshold includes a "primary clock count threshold low" and a "primary clock count threshold high." In certain embodiments, the value of the "primary clock count threshold low" and the "primary clock count threshold high" are determined based on the following expression:

"primary clock count threshold low"+$T$<$2^N \times TS$/
$TR$<"primary clock count threshold high"+$T$ where,
TR is Primary clock period,
TS is the secondary clock period, and
T is the tolerance. The value of tolerance may be 0x0, 0x1, or 0x2, depending on the desired accuracy of the clock malfunction detection.

In an exemplary embodiment, the malfunction detection of primary clock is determined when the value of REF_DIFF is determined to be outside the range as determined by the at least one predetermined threshold. The malfunction of primary clock refers to one of an "out of range clock" condition and "clock stopped" condition.

When it is determined that primary clock is malfunctioning, operation of the system clock is switched from primary clock to the secondary clock. A flag is set to indicate the "out of range clock" condition of primary clock. For example, a "Non-Maskable Interrupt" is generated and forwarded to a central processing unit (CPU), and the system clock will be switched from primary clock to the secondary clock. The flag is cleared by the CPU after rectifying primary clock malfunction. After clearing the flag, the clock to the design is switched back to primary clock. However, if it is determined that primary clock is operating within the predetermined range, no action is required.

In an exemplary implementation of the present disclosure, primary clock is a reference clock for a design application. The frequency of primary clock varies from approximately 4 MHz to approximately 150 MHz, and the secondary clock for the device is an external clock having approximately 10 MHz frequency. The values of the GRAY code counter and the secondary clock counter is chosen to be M=8 and N=3, such that primary clock counter is a 8-bit GRAY code counter that is operative with the 4 MHz to 150 MHz primary clock, and the secondary clock counter is a 3-bit binary counter that is operative with the 10 MHz secondary clock.

Pursuant to one exemplary implementation, the secondary counter, such as the 3-bit binary counter, saturates in a time period of $2^3 \times 100$ ns=800 ns. For example, for a primary clock of 20 MHz (TP=50 ns), primary clock counter, such as the 8-bit GRAY code counter, may attain a value d16 (or a hexadecimal value 0x10) at a saturation thereof. Accordingly, when reference clock is 20 MHz, "reference clock count threshold low" register may be programmed to value 0xF and the "reference clock count threshold high" register may be programmed to value 0x11.

For the given case of reference clock of 20 MHz and secondary clock of 10 MHz, if the values of the "reference clock count threshold low" and the "reference clock count threshold high" are programmed to 0xC and 0x14, respectively, in the first threshold register and the second threshold registers, respectively, then the "out of range clock" condition detection of the reference clock may not be performed even though the reference clock varies between 15 MHz to 25 MHz. Accordingly, programming the value of the first threshold register and the second threshold register defines the range for which the "out of range clock" is to be determined, and detection within that range depends on the design accuracy of the clock malfunction detection circuit.

For a more accurate design requirement, the values of the "reference clock count threshold low" and "reference clock count threshold high" may be programmed to occur within a smaller range of values, which may in turn help to achieve a greater degree of accuracy with respect to the reference clock range. Thus, the implementation of the circuit using the GRAY counter and REF_DIFF based approach enables the circuit to detect the clock range accurately.

Wherein the secondary clock frequency is 10 MHz and reference clock frequency varies from 4 MHz to 150 MHz, the suggestive values of the "reference clock count threshold low" and "reference clock count threshold high" is as follows (Table 1)

TABLE 1

| Reference clock (Primary Clock) frequency | Reference Clock Count Threshold Low | Reference Clock Count Threshold High |
|---|---|---|
| On Power up | 0x3 | 0x7A |
| 4 MHz (250 ns) | 0x3 | 0x4 |
| 10 MHz (100 ns) | 0x7 | 0x9 |
| 20 MHz (50 ns) | 0xF | 0x11 |
| 100 MHz (10 ns) | 0x4E | 0x52 |
| 130 MHz (7.69 ns) | 0x66 | 0x6C |
| 150 MHz (6.67 ns) | 0x76 | 0x7A |

As shown in Table 1, upon power up, the default values of the "reference clock count threshold low" and "reference clock count threshold high" are 0x3 and 0x7A, which ensures that the reference clock is within 4 MHz to 150 MHz. The values may later be programmed in the first threshold register and the second threshold register as per the table based on the expected reference clock frequency for a given application. The circuit is first disabled before programming the value in the first threshold register and the second threshold register, and, after programming the first threshold register and the second threshold registers, the circuit for clock malfunction detection is enabled.

Figure 4:
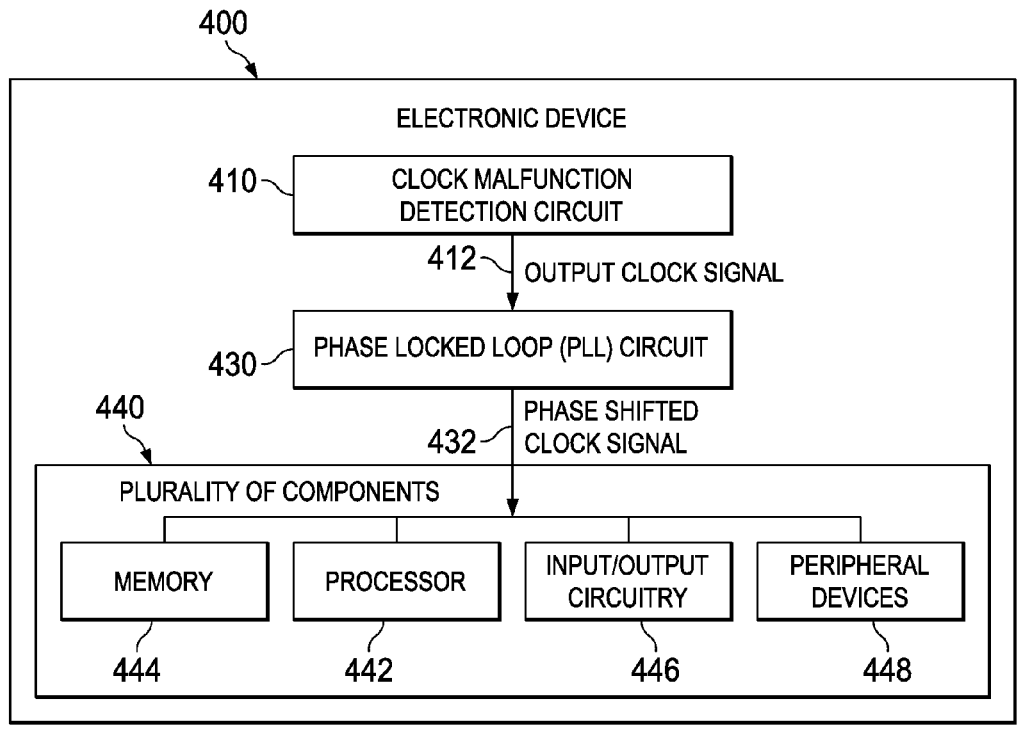
FIG. 4 illustrates a block diagram of an electronic device embodying the clock malfunction detection circuit of FIG. 2 according to an embodiment.

FIG. 4 is a block diagram illustrating an electronic device 400 embodying a clock malfunction detection circuit 410 in accordance with still yet another embodiment. Clock malfunction detection circuit 410 may be implemented as clock malfunction detection circuit 410 in the electronic device 200 explained with reference to FIG. 2. Clock malfunction detection circuit 410 is configured to detect a malfunction of a primary clock, such as a reference clock of the electronic device 400, and to generate an output clock signal 412 indicative of malfunction of primary clock.

The electronic device 400 includes a PLL circuit 430 coupled with or connected to clock malfunction detection circuit 410. Clock malfunction detection circuit 410 is configured to generate a phase shifted output clock signal 432 in response to receiving output clock signal 412. PLL circuit 430 provides phase shifted output clock signal 432 to plurality of components 440 associated with electronic device 400. Plurality of components 440 may include a processor 442, a memory 444, input/output (I/O) circuitry 446, and peripheral devices 448 coupled together by a system bus 450.

In event of a malfunction of primary clock of the electronic device 400, the clock malfunction detection circuit 410 is configured to detect the malfunction of primary clock, and in response to the detection, switches the operation of the electronic device 400 from Primary clock (for example, the reference clock) to a secondary clock circuit. The secondary clock circuit facilitates clock malfunction detection circuit 402 to generate an output clock signal that may be fed to other components of electronic device 400. It will be understood that clock malfunction detection circuit 402 may be an example of clock malfunction detection circuit 200, and accordingly various components of clock malfunction detection circuit 402 are similar in functionality to the corresponding components of clock malfunction detection circuit 200. In one embodiment, the logics for clock malfunction detection circuit 402 are supported by a programmable core of electronic device 400.

Without in any way limiting the scope, interpretation, or application of the claims appearing below, a technical effect of one or more of the exemplary embodiments disclosed herein is to provide circuits and methods for clock malfunction detection. The clock malfunction detection circuit includes a secondary clock for monitoring primary clock of a design application, such as an automotive application. Whenever primary clock is detected to be malfunctioning, the clock malfunction detection circuit switches the operation of the design application from primary clock to the secondary clock until primary clock starts working properly. Particularly, the circuit includes a glitch free clock switch multiplexer circuit for switching the system clock to secondary clock without glitch upon detecting a clock malfunction of primary clock.

The clock malfunction detection circuit is based on digital logic and can be used across the different technology nodes. The digital logic is implemented with a limited number of gates, and therefore may be a cost efficient solution for the clock malfunction detection problem. The circuit takes care of inherent synchronization problems between two asynchronous clock domains without even a synchronization circuit in design. In some embodiments, the circuit is enabled immediately after a system reset de-assertion, and utilizes the default value of the predetermined thresholds for accuracy of the circuit. Later, the accuracy range of the circuit may be programmed based on user preferences. Since the accuracy range is user programmable, the designer can program the values in the programmable register based on an expected range.

It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Various embodiments of the present disclosure, as discussed above, may be practiced with steps and/or operations in a different order, and/or with hardware elements in configurations which are different than those which are disclosed. Therefore, although the technology has been described based upon these exemplary embodiments, it is noted that certain modifications, variations, and alternative constructions are apparent and well within the spirit and scope of the technology.

Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. A clock malfunction detection circuit in a System on chip (SoC) comprising:
   a primary clock circuit comprising a primary clock and a GRAY code counter, the GRAY code counter configured to generate a GRAY code sequence based on a number of clock pulses generated by the primary clock;
   a secondary clock circuit comprising a secondary clock and a secondary clock counter, the secondary clock circuit configured to output a secondary clock pulse on each of a number of saturations of the secondary clock counter;
   a clock gated register circuit associated with the primary clock circuit and the secondary clock circuit and clocked by the secondary clock pulse, the clock gated register circuit configured to store a plurality of values of the GRAY code sequence, and to update the plurality of values of the GRAY code sequence on each of the number of saturations of the secondary clock counter; and
   an error detection circuit associated with the clock gated register circuit and configured to output a signal indicative of malfunction of the primary clock based on a comparison of the updated plurality of values of the GRAY code sequence with at least one predetermined threshold associated with the malfunction of the primary clock,
   wherein the primary clock is operative in a first independent clock domain and the secondary clock is operative in a second independent clock domain, and wherein the secondary clock counter comprises a binary counter.

2. The circuit of claim 1, wherein the plurality of values of the GRAY code sequence comprises a current value of the GRAY code sequence at a current saturation of the secondary clock counter, and a previous value of the GRAY code sequence at a previous saturation of the secondary clock counter.

3. The circuit of claim 2, wherein the clock gated register circuit comprises:
   a first register configured to store the current value of the GRAY code sequence;
   a second register configured to store the previous value of the GRAY code sequence;
   a plurality of GRAY to binary converter circuits associated with the first register and the second register and configured to convert the current value of the GRAY code sequence and the previous value of the GRAY code sequence to binary value; and
   a difference circuit associated with the plurality of GRAY to binary converter circuits and configured to determine a difference of the binary values associated with the current value of the GRAY code sequence and the binary value of the GRAY code sequence.

4. The circuit of claim 1, wherein the error detection circuit comprises:
   a first threshold register configured to store a primary clock count threshold high of the at least one predetermined threshold;
   a second threshold register configured to store a primary clock count threshold low of the at least one predetermined threshold; and
   an error detection logic circuit associated with the first threshold register and the second threshold register, the error detection logic circuit configured to compare the updated plurality of values of the GRAY code sequence with the at least one predetermined threshold.

5. The circuit of claim 4, wherein the value of the primary clock count threshold low and the value of the primary clock count threshold high are determined based on the following expression:
   "primary clock count threshold low" $+T < 2^N X \, TS/TR <$ "primary clock count threshold high" $+T$
   where, TR is a primary clock period, TS is a secondary clock period, and T is a tolerance associated with an accuracy of the clock malfunction detection circuit.

6. The circuit of claim 1, wherein the malfunction is one of an 'out of range clock' condition and a 'clock stopped' condition of the primary clock.

7. The circuit of claim 1, further comprising:
   a clock switch multiplexer circuit associated with the error detection circuit, the primary clock circuit and the secondary clock circuit, and configured to select the secondary clock circuit and deselect the primary clock circuit when the malfunction of the primary clock is detected.

8. A method of clock malfunction detection in a System on chip (SoC) comprising:
   generating a GRAY code sequence based on a number of clock pulses generated by a primary clock;
   outputting a secondary clock pulse on each of a number of saturations of a secondary clock counter associated with a secondary clock circuit;
   storing a plurality of values of the GRAY code sequence by a clock gated register circuit, and updating the plurality of values of the GRAY code sequence for each of a number of saturations of the secondary clock counter, the clock gated register circuit being clocked by the secondary clock pulse; and
   generating a signal indicative of malfunction of the primary clock based on a comparison of the updated plurality of values of the GRAY code sequence with at least one predetermined threshold associated with the malfunction,
   wherein the primary clock is operative in a first independent clock domain and the secondary clock is operative in a second independent clock domain, and wherein the secondary clock counter is a binary counter.

9. The method of claim 8, wherein the plurality of values of the GRAY code sequence comprises a current value of the GRAY code sequence at a current saturation of the secondary clock counter, and a previous value of the GRAY code sequence at a previous saturation of the secondary clock counter.

10. The method of claim 9, further comprising:
    converting each of the current value of the GRAY code sequence and the previous value of the GRAY code sequence to a binary value; and
    determining a difference of the binary values associated with the current value of the GRAY code sequence and the previous value of the GRAY code sequence.

11. The method of claim 10, wherein the at least one predetermined threshold comprises a primary clock count threshold high value and a primary clock count threshold low value.

12. The method of claim 11, wherein the values of the primary clock count limit low and the primary clock count limit low are determined based on the following expression:
    primary clock count limit low $+T < 2^N X \, TS/TR <$ primary clock count limit high $+T$;
    wherein TR is a primary clock period, TS is a secondary clock period, and T is a tolerance associated with a clock malfunction detection accuracy.

13. The method of claim 8, wherein the malfunction is associated with one of an out of range clock condition and a clock stop condition of the primary clock.

14. An electronic device comprising:
    a clock malfunction detection circuit comprising:
    a primary clock circuit comprising a primary clock and a GRAY code counter, the GRAY code counter configured to generate a GRAY code sequence based on a number of clock pulses generated by the primary clock;
    a secondary clock circuit comprising a secondary clock and a secondary clock counter, the secondary clock circuit configured to output a secondary clock pulse on each of a number of saturations of the secondary clock counter;
    a clock gated register circuit associated with the primary and secondary clock circuits and clocked by the secondary clock pulse, the clock gated register circuit configured to store a plurality of values of the GRAY code sequence, and to update the plurality of values of the GRAY code sequence on each of the number of saturations of the secondary clock counter;
    an error detection circuit associated with the clock gated register circuit and configured to output a signal indicative of malfunction of the primary clock based on a comparison of the updated plurality of values of the GRAY code sequence with at least one predetermined threshold associated with the malfunction of the primary clock; and
    a clock switch multiplexer circuit coupled with the error detection circuit, the primary clock circuit and the secondary clock circuit, the clock switch multiplexer circuit configured to select the secondary clock circuit and deselect the primary clock circuit based on the signal indicative of the malfunction of the primary clock, and to generate an output clock signal; and a phase locked loop (PLL) circuit coupled with the clock switch multiplexer circuit and configured to generate a phase shifted output clock signal and to provide the phase shifted output clock signal to a plurality of components associated with the electronic device, wherein the primary clock is operative in a first independent clock domain and the secondary clock is operative in a second independent clock domain, and wherein the secondary clock counter comprises a binary counter.

15. The electronic device of claim 14, wherein the plurality of values of the GRAY code sequence comprises a current value of the GRAY code sequence at a current saturation of the secondary clock counter, and a previous value of the GRAY code sequence at a previous saturation of the secondary clock counter.

16. The electronic device of claim 14, wherein the clock gated register circuit comprises:

a first register configured to store the current value of the GRAY code sequence;

a second register configured to store the previous value of the GRAY code sequence;

a plurality of GRAY to binary converter circuits associated with the first register and the second register and configured to convert the current value of the GRAY code sequence and the previous value of the GRAY code sequence to binary values; and a difference circuit associated with the plurality of GRAY to binary converter circuits and configured to determine a difference of the binary values associated with the current value of the GRAY code sequence and the binary value of the GRAY code sequence.

17. The electronic device of claim 14, wherein the malfunction is one of an 'out of range clock' condition and a 'clock stopped' condition of the primary clock.

* * * * *